United States Patent
Kondo et al.

(10) Patent No.: US 6,628,555 B2
(45) Date of Patent: Sep. 30, 2003

(54) SEMICONDUCTOR CIRCUIT HAVING A DETECTION CIRCUIT FOR CONTROLLING A POWER BOOSTING CIRCUIT

(75) Inventors: Masataka Kondo, Takatsuki (JP); Kiyoto Oota, Takatsuki (JP); Tomonori Fujimoto, Neyagawa (JP); Yoshihiko Sumimoto, Hirakata (JP)

(73) Assignee: Matsushita Electric Industrial Co. Ltd. (JP)

( * ) Notice: Subject to any disclaimer, the term of this patent is extended or adjusted under 35 U.S.C. 154(b) by 0 days.

(21) Appl. No.: 10/218,307

(22) Filed: Aug. 15, 2002

(65) Prior Publication Data

US 2002/0191447 A1 Dec. 19, 2002

Related U.S. Application Data

(63) Continuation of application No. 09/794,771, filed on Feb. 28, 2001, now Pat. No. 6,459,643.

(30) Foreign Application Priority Data

Mar. 6, 2000 (JP) ........................................ 2000-059707

(51) Int. Cl.[7] ............................................... G11C 29/00
(52) U.S. Cl. ............................ 365/189.09; 365/189.09; 365/226
(58) Field of Search ........................... 365/189.09, 226, 365/201; 327/545, 534, 536

(56) References Cited

U.S. PATENT DOCUMENTS

| | | | | |
|---|---|---|---|---|
| 5,329,168 A | * | 7/1994 | Sugibayashi et al. | 327/535 |
| 5,644,534 A | | 7/1997 | Soejima | 365/185.23 |
| 5,767,735 A | | 6/1998 | Javanifard et al. | 327/536 |
| 5,841,725 A | | 11/1998 | Kang et al. | 365/226 |
| 6,031,420 A | | 2/2000 | Vander Voorde | 327/536 |
| 6,031,422 A | | 2/2000 | Ideler | 327/536 |
| 6,058,063 A | | 5/2000 | Jang | 365/227 |
| 6,201,437 B1 | * | 3/2001 | Kono et al. | 327/545 |
| 6,208,198 B1 | | 3/2001 | Lee | 327/536 |

* cited by examiner

Primary Examiner—Anh Phung
(74) Attorney, Agent, or Firm—Parkhurst & Wendel, L.L.P.

(57) ABSTRACT

A boosting circuit included in a semiconductor integrated circuit for efficiently stabilizing a boosted potential, including a plurality of boosting circuits and a timing control circuit for distributing the operations of the boosting circuits. Boosting operations per operating cycle of a memory increase in number so as to suppress a reduction in boosted source potential, the reduction being caused by consumption. Moreover, it is possible to perform a boosting operation in a time period equal to that of consuming boosted source potential, resulting in an efficient boosting operation.

6 Claims, 14 Drawing Sheets

(BIVPP=L, TP1=TP2=TP3 IS GIVEN IN THE FIGURE)

SEMICONDUCTOR CIRCUIT HAVING A DETECTION CIRCUIT FOR CONTROLLING A POWER BOOSTING CIRCUIT

This application is a continuation of application Ser. No. 09/794,771 filed Feb. 28, 2001, now U.S. Pat. No. 6,459,643 issued Oct. 1, 2002.

FIELD OF THE INVENTION

The present invention relates to a field of a memory device comprising semiconductor integrated circuits. Specifically, the present invention relates to a boosting power circuit required for driving the memory device.

BACKGROUND OF THE INVENTION

Regarding a dynamic memory device, as a method for having access to data of memory devices (memory cells) arranged in a matrix form, a potential is applied to word lines and data is exchanged between bit lines and the memory cells so as to perform reading and writing operations.

FIG. 12 shows memory cell arrays, a sense amplifier, and bit line precharge circuits of a typical dynamic random access memory (DRAM).

Reference numeral 111 denotes the memory cell arrays, reference numeral 112 denotes a bit line pair, reference numeral 113 denotes word lines, reference numeral 114 denotes bit line precharge circuits, reference numeral 115 denotes a sense amplifier, and reference numeral 116 denotes shared gates.

In the memory cell array 111, as for a single memory cell capacitor Co, the memory cell capacitor Co is connected to the source of an access transistor TWL, the bit line 112 is connected to the drain of the access transistor TWL, and the word line 113 is connected to the gate of the access transistor TWL.

The DRAM stores data by accumulating electric charge in the memory cell capacitor Co. A DRAM operating source voltage has been reduced while the DRAM has higher density and larger capacity.

In order to sufficiently secure accumulated electric charge in the memory cell capacitor Co in response to lower source voltage, a method has been generally used for applying a source potential VDD to the memory cell capacitor Co at H level and applying a GND potential thereto at L level. Therefore, as a gate potential of the access transistor TWL for transferring accumulated electric charge to the memory cell capacitor Co, a boosted potential (VPP) is necessary, which is higher in potential than the DRAM source voltage. In order to obtain the potential, assuming that the DRAM source voltage is VDD and the transistor TWL has a threshold voltage of VT, VPPb=VDD+VT has to be satisfied.

Further, upon pre-charging the bit lines in response to lower source voltage VDD, in order to complete the pre-charging operation at high speed to increase a potential of the bit lines to a bit-line pre-charging potential VBP (=VDD/2), H level of a control signal of the bit line precharge circuit 114 is set at a boosted potential VPP.

Moreover, as shown in FIG. 12, the memory cell arrays (111(L), 111(R)) on the both sides of the sense amplifier 115 share the sense amplifier 115. This configuration has been generally adopted to reduce a layout area. Regarding the shared gates 116 as well used, for realizing the above configuration, a boosted potential VPP is set as H level of a gate voltage to accurately transfer data at high speed between the memory cell arrays 111 and the sense amplifier 115.

As described above, in order to perform high-speed reading and writing operations in the DRAM in a stable manner, in addition to the source voltage VDD, a boosted power source VPP is necessary, which is set higher in potential than the source voltage. As a method for realizing such a voltage VPP, a boosting circuit having a charge pump circuit and so on therein is provided and the source voltage VDD is boosted to a high source potential VPP so as to obtain a high source potential.

FIG. 13 shows a conventional boosting power circuit.

Reference numeral 117 denotes a boosting circuit, reference numeral 118 denotes an auxiliary boosting circuit, reference numeral 119 denotes a timing control circuit, reference numeral 120 denotes an oscillator, reference numeral 121 denotes a detection circuit, and reference numeral 122 denotes an overboosting preventing circuit.

The boosting circuit 117 and the auxiliary boosting circuit 118 are realized by charge pump circuits which perform a boosting operation by transferring electric charge. Also, the outputs of the boosting circuit 117 and the auxiliary boosting circuit 118 are connected in parallel with each other.

The auxiliary boosting circuit 118 is provided for securing a boosted source potential VPP when a memory is in a standby status, which is achieved by setting its capability of supplying electric charge lower than that of the boosting circuit 117 so as to suppress consumption of current.

The boosting circuit 117 operates in synchronization with an internal memory activation signal IRAS when the memory is activated. Meanwhile, the auxiliary boosting circuit 118 operates asynchronously to the activation of the memory due to self-induced oscillation of the oscillator 120, based on a result detected by the detection circuit 121 on a boosted source potential VPP.

The overboosting preventing circuit 122 is provided for preventing a temporary overboosting of a boosted voltage VPP particularly when a source voltage VDD is high. The overboosting preventing circuit 122 makes it possible to prevent damage on an element of the device and to obtain reliability.

Here, FIG. 14 shows a schematic timing chart of the operation of the DRAM.

In FIG. 14, reference character CLK denotes a clock input signal, reference character RAS denotes a row address strobe input signal, reference character CAS denotes a column address strobe input signal, and reference character WE denotes a writing permission input signal.

In an example shown by FIG. 14, a reading cycle and a writing cycle are carried out in three clock periods. Pre-charging the bit lines is suspended substantially at the same time when the internal memory activation signal IRAS rises so as to determine a row address. And then, the word line corresponding to the selected row address is activated.

The word line is activated, so that electric charge accumulated in the memory cell capacitor is transferred to the bit line and a potential of the bit line is increased by a voltage value smaller than the bit line precharge potential VBP (=VDD/2) when H data is read. A potential of the bit line decreases by a voltage value smaller than the bit line precharge potential VBP when L data is read. In such a variation in potential of the bit line, a potential of the bit line is amplified to VDD at H level and to 0V at L level when the sense amplifier driving signal SE is set at H level.

The IRAS falls at a rising edge of the third clock, the word line is deactivated, and the sense amplifier driving signal SE is set at L level. Thereafter, a pre-charging operation for the bit line begins so as to precharge the bit line to the VBP. A series of operations are completed at this moment.

As indicated by circles in FIG. 14, the timings of consuming the boosted potential VPP generated in the boosting power circuit conform to the timing of activating the word line and the timing of operating a bit line precharge signal and the shared gates. This signal is substantially in synchronization with a rising edge and a falling edge of the internal memory activation signal IRAS.

In response to the above consumption of a boosted potential, as for the operation of the boosting circuit, it is possible to adopt two operating timings including performing a boosting operation only at a rising edge of the internal memory activation signal IRAS and performing a boosting operation at both of rising and falling edges of the IRAS.

As described above, as a timing of operating the boosting power circuit when the memory is in an activated status, it is possible to adopt two timings including operating in synchronization with a rising edge of the internal memory activation signal IRAS and operating both at rising and falling edges of the IRAS.

In a circuit using the former operating timing, boosted potentials conform to each other at a timing of activating the word lines. Meanwhile, electric charge is not supplied to the VPP by the boosting circuit upon precharging the bit line and activating the shared gates. Thus, an operating margin of the memory may be reduced due to a reduction in boosted potential.

Meanwhile, in a circuit using the latter boosting timing, the higher operating frequency of the memory, it is more difficult to obtain time required for boosting, resulting in an insufficient amount of transferred electric charge. Consequently, the operating efficiency of the boosting circuit is deteriorated.

A memory capacity and an operating speed of the DRAM both have been increased in response to a semiconductor circuit whose pattern has been finer in recent years. Hence, the conventional configuration is disadvantageous in stabilizing and smoothing boosted voltage and ensuring boosting capability.

Further, in response to a larger memory capacity resulted from a recent finer DRAM with higher density, gates requiring boosted power source increase in number. For this reason, capability of the boosted power source is demanded. Moreover, an operating speed of the memory is also inclined to increase. Therefore, in the boosting power circuit with the conventional configuration having a single charge pump circuit, the following problem may become obvious: a boosting operation cannot catch up with a consuming speed of the boosted power source, thereby deteriorating efficiency of the boosting circuit.

In response to variation in boosted source voltage that is caused by an increase in consumption, for example, it is possible to increase a smoothing capacitor. However, this solution increases a chip size so as to be disadvantageous in cost.

Consequently, the boosting power circuit with the conventional configuration has the following problems.

(1) Timings of operating the boosting circuit and consuming boosted voltage do not conform to each other and the timings are not appropriate, so that variation in voltage may be larger and an operating margin may be reduced.

(2) While a capacity of the memory is increased with higher speed, electric charge to be transferred for boosting increases. Thus, it is difficult to speed up the boosting operation with a single charge pump circuit, so that the boosting circuit has to operate at low boosting efficiency. Under some circumstances, a target boosted voltage value may not be achieved.

DISCLOSURE OF THE INVENTION

An object of the present invention is to provide a semiconductor integrated circuit including a new boosting power circuit, which is devised to solve a disadvantage of a boosting power circuit included in a conventional semiconductor integrated circuit.

According to the semiconductor integrated circuit of the present invention, a plurality of main charge pump circuits perform a boosting operation, which has been conventionally performed by a single main charge pump circuit, boosting time is distributed, and a boosting timing is optimized, thereby reducing variation in voltage and complying with high speed.

A semiconductor integrated circuit according to embodiment 1 of the present invention, which includes a function block and a boosting power circuit used in the function block, is characterized in that the boosting power circuit has a plurality of boosting circuits operating in synchronization with a signal for controlling the operation of the function block and a timing control circuit for producing a control signal of the plurality of boosting circuits in response to the signal for controlling the operation of the function block, the timing control circuit distributing the operations of the plurality of boosting circuits.

A semiconductor integrated circuit according to embodiment 2 of the present invention, which includes a memory block and a boosting power circuit used in the memory block, is characterized in that the boosting power circuit has a plurality of boosting circuits operating in synchronization with a signal for controlling the operation of the memory block and a timing control circuit for producing a control signal of the plurality of boosting circuits in response to the signal for controlling the operation of the memory block. The timing control circuit produces a first control signal, which is inverted after first delay time elapses at a timing of inactivating a memory activation signal, relative to a timing of activating the memory activation signal, and a second control signal operating after second delay time elapses relative to the first control signal, and the timing control circuit similarly produces a plurality of control signals for controlling the plurality of boosting circuits. The plurality of control signals distributes the operations of the plurality of boosting circuits.

A semiconductor integrated circuit according to embodiment 3 of the present invention includes a plurality of boosting circuits operating in synchronization with a memory activation signal, an auxiliary boosting circuit operating asynchronously to a memory activation signal with smaller capability of supplying electric charge than that of the boosting circuit, a timing control circuit for producing a control signal of the plurality of boosting circuits in response to a memory activation signal, an oscillator performing self-induced oscillation for the auxiliary boosting circuit, and a detection circuit for detecting a potential of boosting power source and controlling the operations of the timing control circuit and the oscillator, the timing control circuit distributing the operations of the plurality of boosting circuits, the boosting circuit including a charge pump circuit and a control signal producing circuit for producing a control signal of the charge pump circuit, the charge pump circuit including a electric charge transfer gate, first boosting means for doubling source voltage relative to the source voltage, and second boosting means for tripling the source voltage relative to the source voltage and the first boosted potential, the electric charge transfer gate having a source electrode connected to an output terminal and a drain electrode connected to the first boosted potential, the second boosted potential being connected to a gate electrode of the electric charge transfer gate so as to supply the first boosted potential to the output terminal.

A semiconductor integrated circuit according to embodiment 4 of the present invention includes a plurality of boosting circuits operating in synchronization with a memory activation signal, an auxiliary boosting circuit operating asynchronously to a memory activation signal with smaller capability of supplying electric charge than that of the boosting circuit, a timing control circuit for producing a control signal for the plurality of boosting circuits in response to a memory activation signal, an oscillator performing self-induced oscillation for the auxiliary boosting circuit, and a detection circuit for detecting a potential of boosted power source and controlling the operations of the timing control circuit and the oscillator, the timing control circuit distributing the operations of the plurality of boosting circuits, the boosting circuit including a charge pump circuit and a control signal producing circuit for producing a control signal of the charge pump circuit, the charge pump circuit including a electric charge transfer gate, first boosting means for doubling source voltage relative to the source voltage, and second boosting means for tripling the source voltage relative to the source voltage and the first boosted potential, $(n-1)_{th}$ boosting means for boosting the source voltage by n times relative to the source voltage and (n-1)-time boosted potential of the source voltage, and $n_{th}$ boosting means for boosting the source voltage by (n+1) times relative to the $(n-1)_{th}$ boosted potential and the first boosted potential, the electric charge transfer gate having a source electrode connected to an output terminal and a drain electrode connected to the $(n-1)_{th}$ boosted potential, the $n_{th}$ boosted potential being connected to a gate electrode of the electric charge transfer gate so as to supply the $(n-1)_{th}$ boosted potential to the output terminal.

The semiconductor integrated circuit described in embodiment 5 of the present invention, according to embodiment 4, is characterized in that the charge pump circuit can be controlled by the same control signal, which is generated in the control signal producing circuit for controlling the charge pump circuit, regardless of a boosting multiple of the charge pump circuit.

A semiconductor integrated circuit according to embodiment 6 of the present invention includes a plurality of boosting circuits operating in synchronization with a memory activation signal, an auxiliary boosting circuit operating asynchronously to a memory activation signal with smaller capability of supplying electric charge than that of the boosting circuit, a timing control circuit for producing a control signal for the plurality of boosting circuits in response to a memory activation signal, an oscillator performing self-induced oscillation for the auxiliary boosting circuit, and a detection circuit for detecting a potential of boosted power source and controlling the operations of the timing control circuit and the oscillator, the timing control circuit distributing the operations of the plurality of boosting circuits, the detection circuit including a voltage drop circuit for reducing a voltage of a boosted potential by a constant current operation, a constant voltage generating circuit for generating constant voltage by a current mirror circuit, and first comparing means, the first comparing means comparing magnitudes of a reference potential generated by the constant voltage generating circuit and an output potential of the voltage drop circuit.

A semiconductor integrated circuit described in embodiment 7 of the present invention, according to embodiment 6, is characterized in that the first comparing means is configured by three differential amplifiers, a voltage drop potential generated from a boosted voltage in the voltage drop circuit is inputted to one of the inputs of a first differential amplifier, a constant voltage generated in the constant voltage circuit is inputted to the other input, the constant voltage is inputted to one of the inputs of a second differential amplifier, the voltage drop potential generated in the voltage drop circuit is inputted to the other input, an output signal of the first differential amplifier is used as one of the inputs of the third differential amplifier, and an output signal of the second differential amplifier is used as the other input, so that slight variation in voltage can be detected at high speed.

A semiconductor integrated circuit described in embodiment 8 of the present invention, according to embodiment 6, is characterized in that the detection circuit includes a voltage measuring terminal, second comparing means, a P-channel transistor, and an N-channel transistor, the second comparing means having the constant voltage connected to one of the inputs of the second comparing means and the voltage measuring terminal connected to the other input of the second comparing means, the P-channel transistor having a gate electrode connected to an output of the second comparing means, a drain electrode connected to a source potential, and a source electrode connected to the voltage measuring terminal, the N-channel transistor having a gate electrode connected to source potential, a source electrode connected to the voltage measuring terminal, and a drain electrode connected to a ground potential, a potential equal to that of the constant voltage, which is generated in the constant voltage circuit, is outputted to the voltage measuring terminal so as to measure the constant voltage.

A semiconductor integrated circuit described in embodiment 9 of the present invention, according to embodiment 6, is characterized in that the voltage drop circuit included in the detection circuit is provided with a voltage conversion circuit for converting source voltage to boosted source potential, a switch configured by a P-channel transistor and an N-channel transistor, and a second voltage drop circuit being activated only when the switch is turned on, an inverted signal of the state deciding signal has amplitude which is made equal to a boosted source potential via the voltage conversion circuit, the potential is applied to a gate potential of the P-channel transistor switch, and the state deciding signal is applied to a gate potential of the N-channel transistor switch, so that the state deciding signal changes output current applied to the voltage drop circuit, thereby achieving a high-speed operation.

A semiconductor integrated circuit described in embodiment 10 of the present invention, according to embodiment 6, is characterized in that the comparing means includes a differential amplifier having two driving transistors, constant voltage generated in the constant voltage circuit is applied to a gate electrode of one of the driving transistors and a state deciding signal is applied to a gate electrode of the other driving transistor, so that the state deciding signal changes responding speed of the differential amplifier, thereby changing an operating speed.

A semiconductor integrated circuit described in embodiment 11 of the present invention, according to embodiment 6, is characterized in that the detection circuit includes a plurality of test mode control signals as inputs, and a deciding output of the detection circuit or a first test mode control signal of the plurality of test mode control signals permits the boosting circuit to always be operated regardless of boosted potential.

A semiconductor integrated circuit described in embodiment 12 of the present invention, according to embodiment 6, is characterized in that the detection circuit includes an test mode in which a second test mode control signal of the plurality of test mode control signals activates the second comparative operator so as to measure the constant voltage from the voltage measuring terminal.

A semiconductor integrated circuit described in embodiment 13 of the present invention, according to embodiment 3, is characterized in that the control signal generating circuit for controlling the charge pump circuit includes an test mode in which an inverted logical sum is obtained on an input signal of the control signal producing circuit and a third test mode control signal of the plurality of test mode control signals so as to suspend the charge pump circuit.

A semiconductor integrated circuit described in embodiment 14 of the present invention, according to embodiment 9 or 10, is characterized in that the timing control circuit produces a state deciding signal for deciding whether a memory is activated or inactivated, the state deciding signal is activated according to an activating timing of the memory activation signal and is inactivated after predetermined delay time elapses from a timing of inactivating the memory activation signal.

As earlier mentioned, with the configuration of the semiconductor integrated circuit according to the present invention:

(1) The plurality of boosting circuits permits a boosting operation in synchronization with a consuming timing, and it is possible to suppress variation of a boosted potential VPP as compared with a boosting power circuit using a single boosting circuit.
(2) The charge pump circuit used as a boosting circuit has a capability limit of 2VDD and an operation can be performed with a sufficient margin even in the case of a lower source voltage VDD. Further, the charge pump circuit can be readily expanded to a triple or quadruple boosting circuit, and it is possible to use the same control signal as that of a double boosting circuit.
(3) Since the detection circuit is characterized by the absence of dependence on source voltage, an overboosting preventing circuit is not necessary even when source voltage is high.
(4) Operating time of the boosting circuit is distributed so as to provide sufficient time for transferring electric charge per charge pump circuit. For this reason, it is possible to improve efficiency of the circuit as a whole.
(5) Since boosting is distributed, variation of the boosted source voltage VPP is reduced. Hence, as compared with a boosting power circuit using a single boosting circuit, a smoothing capacitor can be reduced so as to achieve small layout size.

EMBODIMENTS OF THE INVENTION

Referring to FIGS. 1 to 11, the following will describe Embodiment of a semiconductor integrated circuit according to the present invention.

Figure 1:
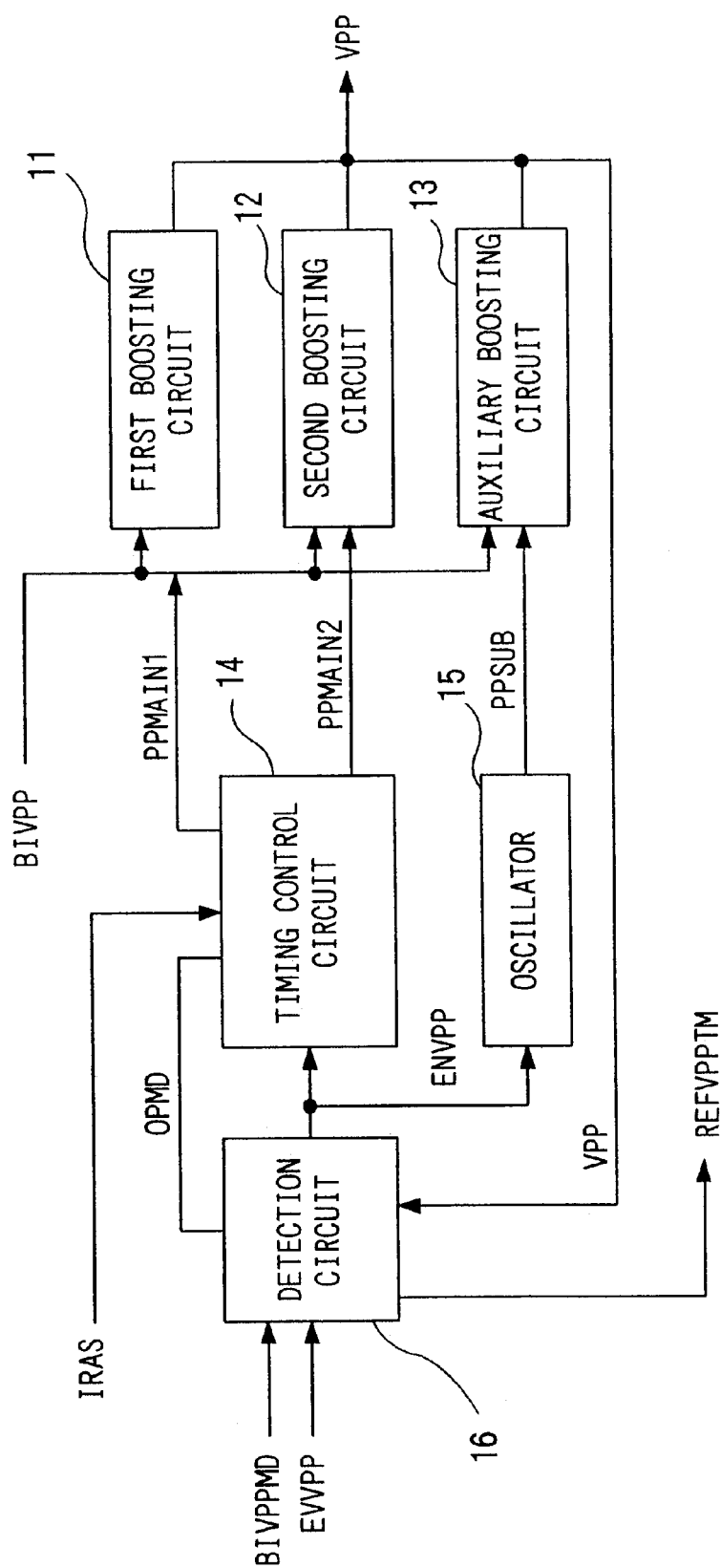
FIG. 1 is a block diagram showing a boosting power circuit of the present invention.

FIG. 1 shows the configuration of a boosting power circuit in the semiconductor integrated circuit, which includes a memory block serving as a function block and a the boosting power circuit used in the memory block.

Figure 12:
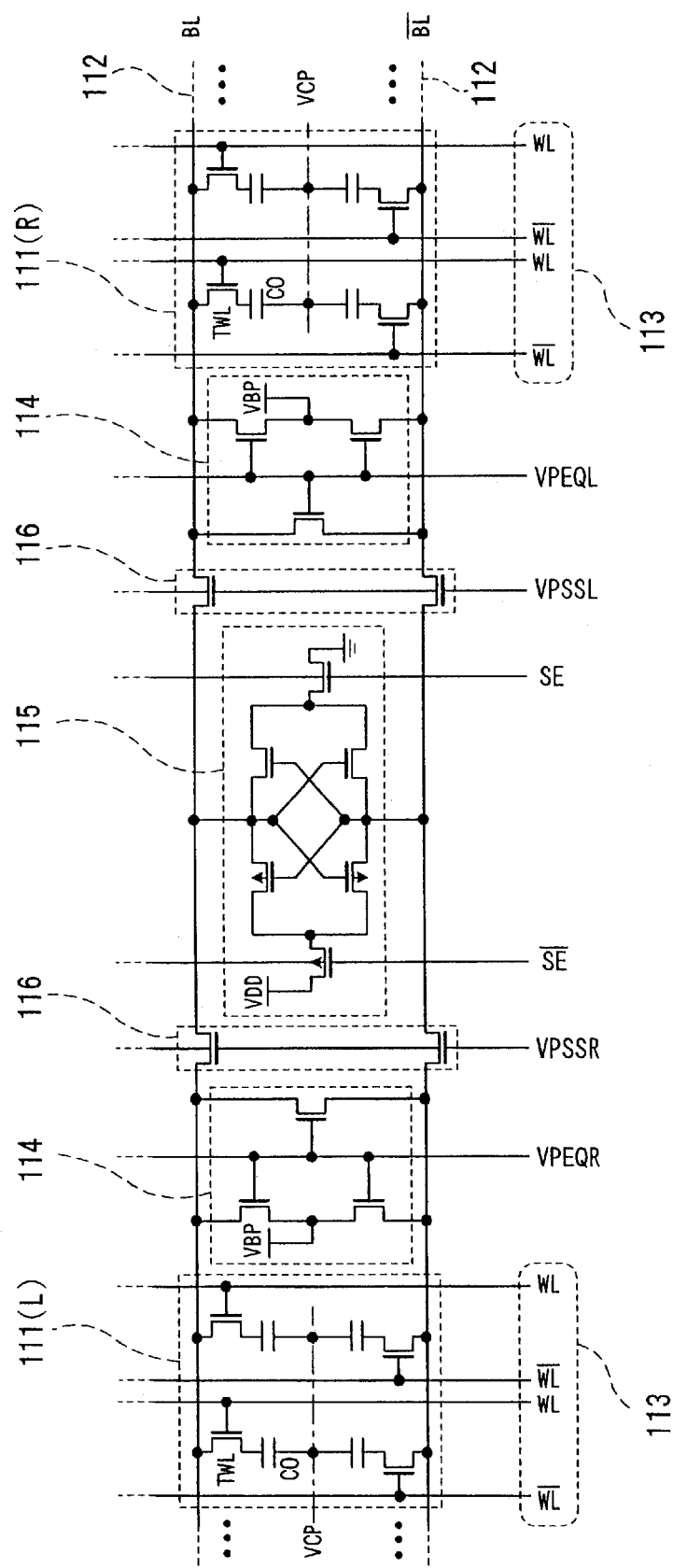
FIG. 12 is a circuit diagram showing memory cell arrays and a sense amplifier.
Figure 13:
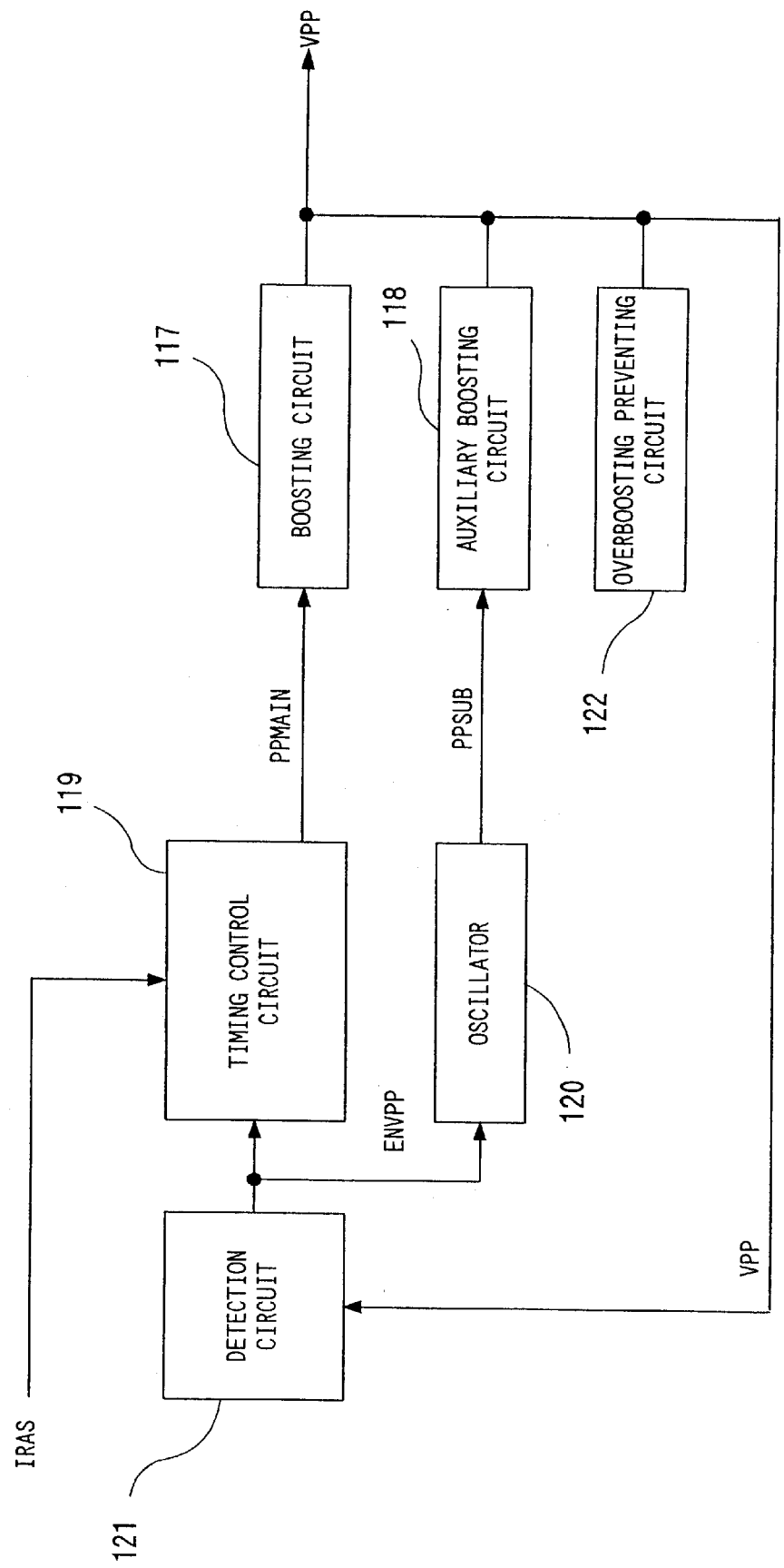
FIG. 13 is a structural diagram showing a conventional boosting power circuit.
Figure 14:
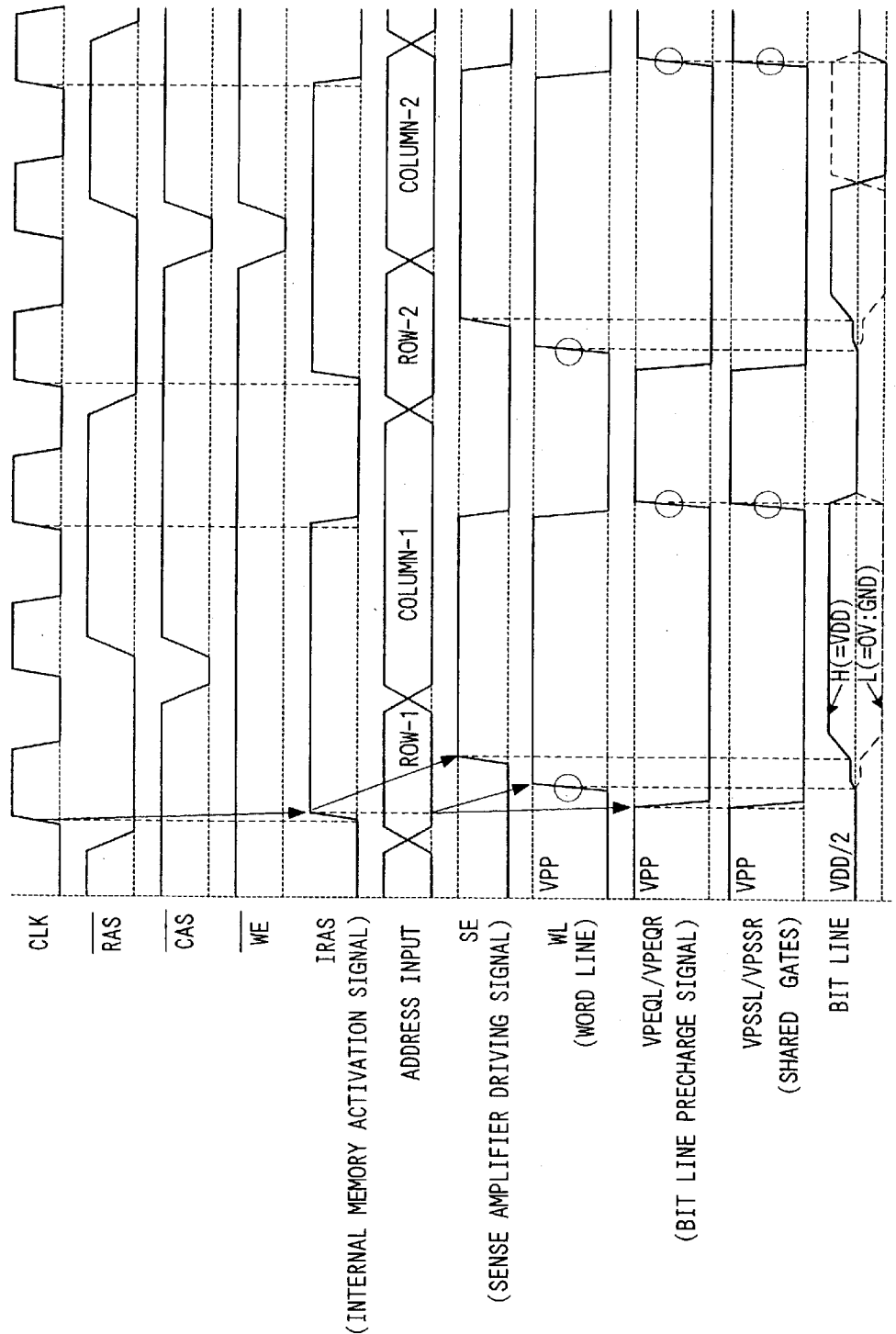
FIG. 14 is a timing chart showing the operation of a DRAM.

To be specific, FIG. 1 shows the boosting power circuit integrated instead of a conventional boosting power circuit shown in FIG. 13, which is used for memory cell arrays and a sense amplifier of FIG. 12.

In FIG. 1, reference numeral 11 denotes a first boosting circuit, reference numeral 12 denotes a second boosting circuit, reference numeral 13 denotes an auxiliary boosting circuit, reference numeral 14 denotes a timing control circuit, reference numeral 15 denotes an oscillator, and reference numeral 16 denotes a detection circuit.

The first boosting circuit 11 and the second boosting circuit 12 are equal to each other in boosting capability. The auxiliary boosting circuit 13 has lower capability of supplying electric charge than the first and second boosting circuits 11 and 12. The first and second boosting circuit 11 and 12, and the auxiliary boosting circuit 13 are each configured by charge pump circuits and a logic circuit for producing control signals of the charge pump circuits. The control signal distributes timing according to variation of an edge of an input signal from the timing control circuit to operate the charge pump.

The detail of the logic circuit will be discussed later.

The first and second boosting circuits 11 and 12 perform a boosting operation only when a memory operates, and boosting operation signals PPMAIN1 and PPMAIN2 are produced by an internal memory activation signal IRAS. Thus, the first and second boosting circuits 11 and 12 operate in synchronization with the internal memory activation signal.

The auxiliary boosting circuit 13 is driven by the oscillator 15, which operates when a boosting deciding signal ENVPP (a third test mode control signal) is at H level. The auxiliary boosting circuit 13 operates asynchronously to the memory activation signal so as to secure a boosted potential VPP when the memory is in a standby status. Further, when the memory is in an activated status, an internal control signal OPMD (a status detection signal) is set at H level and the detection circuit 16 increases in responding speed so as to prevent overboosting. When the memory is in a standby status, OPMD is set at L level so as to switch the detection circuit 16 to a standby status, thereby reducing consumption of current.

Input signals to the circuit of FIG. 1 are the internal memory activation signal IRAS and three kinds of control signals, i.e., BIVPPMD (a first test mode control signal), EVVPP (a second test mode control signal) and BIVPP (a third test mode control signal), for setting an operation mode. Output signals from the circuit are the boosted source potential VPP and REFVPPTM which permits measurement from the outside by copying an internal potential.

Figure 2:
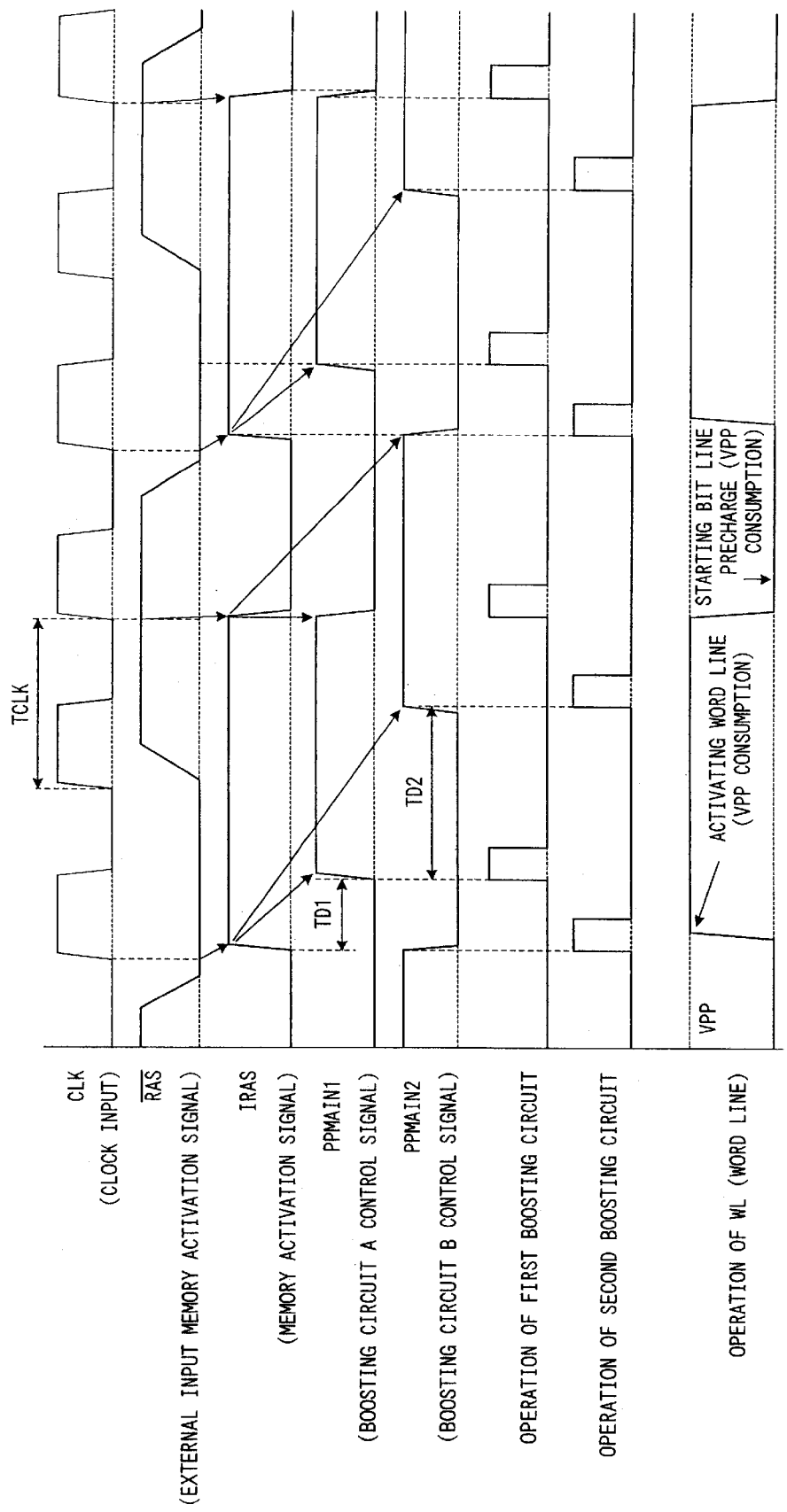
FIG. 2 is an operating timing chart of the boosting power circuit of the present invention.

FIG. 2 shows an operating timing chart of the circuit shown in FIG. 1.

In FIG. 2, reference character CLK denotes a clock input and reference character RAS denotes a row address strobe input signal. Moreover, in FIG. 2, BIVPP, BIVPPMD, and EVVPP serving as test mode setting signals are all set at L level. Further, it is assumed that the signals ENVPP and OPMD for connecting the detection circuit 16 and the timing control circuit 14 are both set at H level. The row address strobe signal RAS is made synchronous with a clock and to act as an input to the boosting power circuit in FIG. 1. The input is shown as the internal memory activated signal IRAS in FIG. 1.

An actuating signal PPMAIN1 of the first boosting circuit 11 rises after delay time TD1 elapses from the rising of the IRAS, and PPMAIN1 falls in synchronization with the falling of the IRAS.

An actuating signal PPMAIN2 of the second boosting circuit 12 rises after delay time (TD1+TD2) elapses from the rising of the IRAS, and PPMAIN2 falls after delay time TD2 elapses from the falling of the IRAS. Boosting operations are carried out by charge pumps of the first and second boosting circuits 11 and 12, respectively on both of rising and falling edges of the signals PPMAIN1 and PPMAIN2.

According to the above boosting timings, appropriate values can be obtained by adjusting times TD1 and TD2 for delaying the internal memory activation signal IRAS. In the example shown in FIG. 2, relative to a DRAM operating clock TCLK, a falling edge of the PPMAIN2 is synchronization with a rising edge of the IRAS in the case where the delay time TD2 is equal to TCLK. Under this condition, the following timing is achieved: the first boosting circuit 11 performs a boosting operation according to the time when a precharge signal and shared gates are activated, and the second boosting circuit 12 performs a boosting operation according to the time when the word line is activated.

As described above, the first and second boosting circuits 11 and 12 are driven respectively at both of rising and falling edges of the PPMAIN1 and PPMAIN2. After the operation of the second boosting circuit 12 is completed for performing a boosting operation according to timing of activating the word line, the first boosting circuit 11 subsequently performs a boosting operation. Thus, it is possible to suppress a reduction in potential of the boosted source voltage VPP.

Additionally, the time period when the PPMAIN1 and PPMAIN2 are at L level is represented by (TD1+TCLK). Hence, $$TD1+TCLK=3TCLK,$$

namely, $$TD1=TCLK/2$$

is satisfied, it is possible to set a duty ratio of PPMAIN1 and PPMAIN2 at 50%. At this moment, transferred electric charge is equal at both of rising and falling edges of the PPMAIN1 and PPMAIN2, so that highest boosting efficiency can be maintained.

The following will discuss the detail of the operation regarding the circuits constituting the boosting power circuit.

Figure 3:
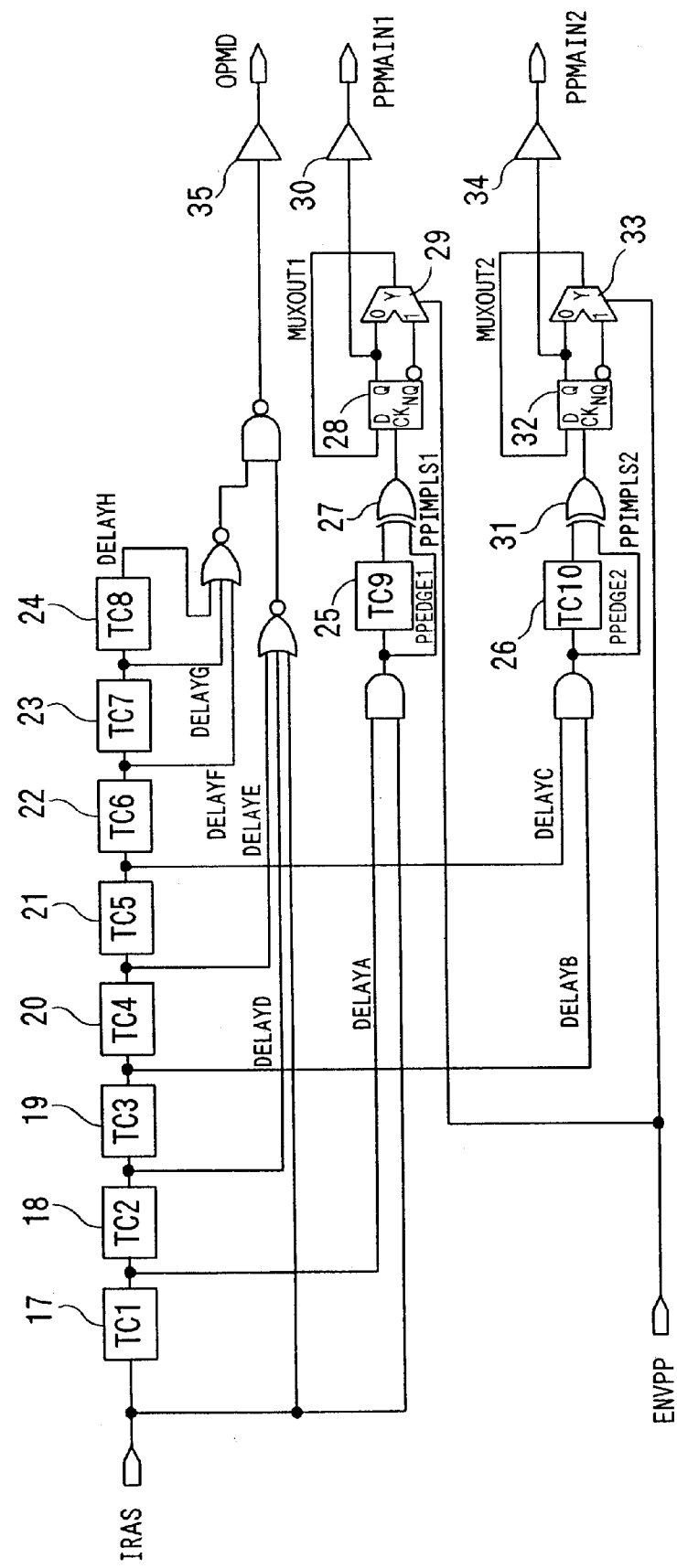
FIG. 3 is a structural diagram showing a timing control circuit.
Figure 4:
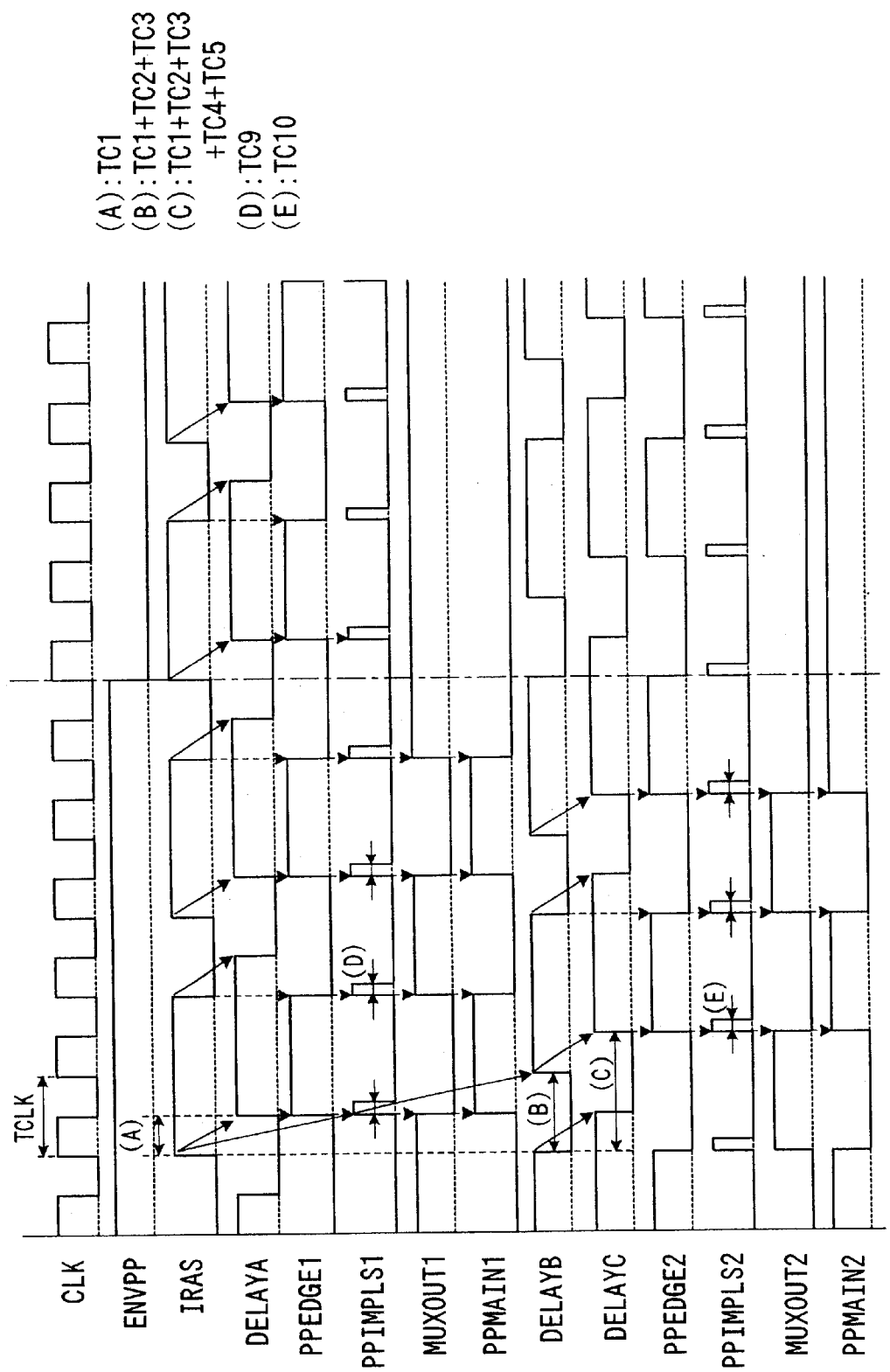
FIG. 4 is a diagram showing a timing chart (normal operation) of the timing control circuit.

FIG. 3 shows an example of a circuit for realizing the timing control circuit 14. FIG. 4 is a timing chart showing an operation for producing the PPMAIN1 and PPMAIN2 by internal nodes of the timing control circuit 14.

Input signals to the timing control circuit 14 are the internal memory activation signal IRAS and the boosting circuit operation deciding signal ENVPP. The signal ENVPP is set at L level when the boosted voltage VPP is detected by the detection circuit 16 and is sufficiently boosted, and the signal ENVPP is set at H level when boosting is not sufficient to achieve a predetermined voltage.

Output signals of the timing control circuit 14 are the PPMAIN1 for driving the first boosting circuit 11, the PPMAIN2 for driving the second boosting circuit 12, and a control signal OPMD which is set at H level during the operation of the memory and is used for increasing responding speed of the detection circuit.

The output signals are produced by delay buffers connected in series from the internal memory activation signal IRAS. Reference numerals 17 to 26 denote delay circuits and delay times are denoted as TC1 to TC10. Reference numerals 27 and 31 denote exclusive logical sums, reference numerals 28 and 32 denote D-type flip flops, reference numerals 29 and 33 denote multiplexers and reference numerals 30, 34, and 35 denote buffers.

An internal node DELAYA is a signal produced by delaying the signal IRAS by the time TC1 by the delay circuit 17. A signal PPEDGE1 produced by ANDing the DELAYA and IRAS is delayed by the time TC1 from a rising edge of the IRAS and is in synchronization with a falling edge of the IRAS.

Only when ENVPP is at H level, an exclusive OR is computed of the PPEDGE1 and a signal produced by delaying the PPEDGE1 by the time TC9 via the delay circuit 25 to produce an edge of the PPMAIN1, so that a pulse with a pulse width TC9 is produced in synchronization with a varied edge of the PPEDGE in the internal node PPIMPLS1.

The signal is inputted to a clock input terminal CK of the D-type flip flop 28. The multiplexer 29 is set such that an output Q of the D-type flip flop is selected when the ENVPP is at L level and an output NQ of the D-type flip flop 28 is selected when the ENVPP is at H level. A MUXOUT1 serving as an output of the multiplexer 29 returns to an input terminal D of the D-type flip flop 28., According to the above circuit configuration, only when the ENVPP is at H level, the D-type flip flop 28 inverts an output on a rising edge of the PPIMPLS1. Regarding a signal obtained from an output terminal Q of the D-type flip flop 28, when the ENVPP is at H level, a signal is obtained which varies at the same timing as the PPEDGE1. When the ENVPP varies to L level, a signal is obtained which maintains an output level of the H-level ENVPP. The PPMAIN1 is produced from an output terminal of the D-type flip flop 28 via the buffer 30.

In the same manner, the PPMAIN2 produces a signal PPEDGE2 by ANDing an internal node DELAYB and a node DELAYC. The internal node DELAYB is produced by delaying IRAS by time (TC1+TC2+TC3) and the node DELAYC is produced by delaying the DELAYB by time (TC4+TC5). The delay circuit 26 and the exclusive OR 31 produce a signal PPIMPLS2, which has a pulse width of the TC10 and is in synchronization with variation of an edge of the PPEDGE2. The signal is realized by producing a signal varying only when the ENVPP is at H level, by using the D-type flip flop 32 and the multiplexer 33.

When the ENVPP is at H level, the PPMAIN1 and PPMAIN2 are similar to each other with a phase difference of time (TC1+TC2+TC3).

The following will discuss the function of a control signal OPMD which changes responding speed of the detection circuit when the memory is in an operating mode, by referring to an example with a low operating speed.

Figure 5:
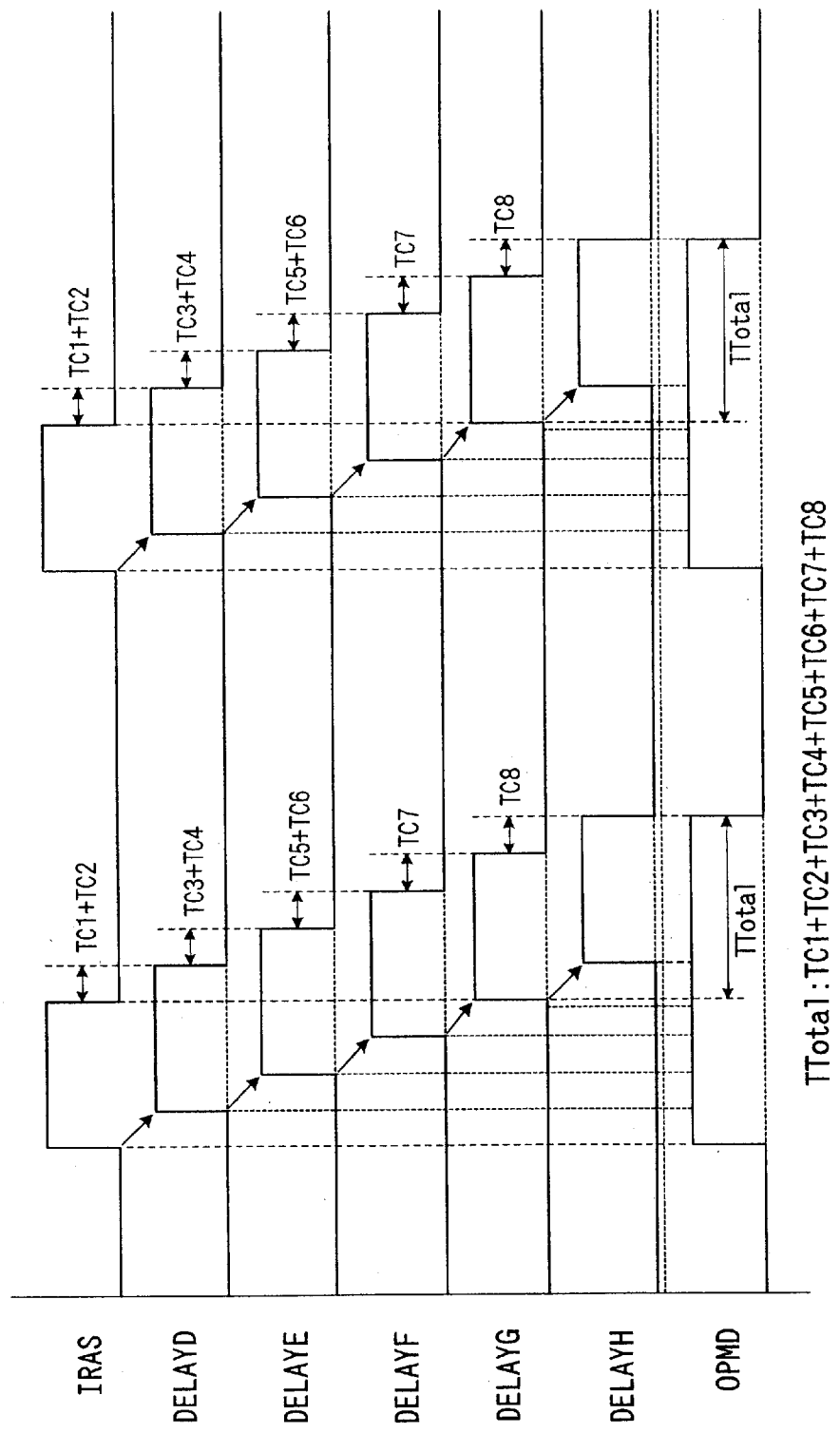
FIG. 5 is a diagram showing a timing chart (low-speed operation) of the timing control circuit.

FIG. 5 is a timing chart showing the timing of the OPMD in the case where the memory has a low operating speed.

The OPMD is produced from the following six signals, which include the IRAS, a signal DELAYD produced by delaying IRAS by time (TC1+TC2), a signal DELAYE produced by delaying DELAYD by time (TC3+TC4), a signal DELAYF further delayed by time (TC5+TC6), a signal DELAYG further delayed by time TC7, and a signal DELAYH further delayed by time TC8. To be specific, the OPMD is produced by passing through the buffer 35 a signal forming a negation of a logical sum of the IRAS, DELAYD, and DELAYE, and a signal forming a negation of a logical sum of the DELAYF, DELAYG, and DELAYH, as inverted signals of a logical product.

As a result, the OPMD is in synchronization with a rising edge of the IRAS and is at H level from a falling edge of the IRAS for the total time of TC1 to TC8. Namely, the memory is determined to be in an inactivated status from a falling edge of the IRAS for the total time of TC1 to TC8, and an output of the OPMD varies to L level.

The OPMD is always outputted at H level in the operation with a high-speed frequency. However, in the case where a clock frequency is slow and the time period when the IRAS is at L level is longer than the total time of TC1 to TC8, namely, when the operating clock of the DRAM operates the memory with an operating clock lower than or equal to the total of TC1 to TC8, the OPMD varies to H level and L level.

Figure 6:
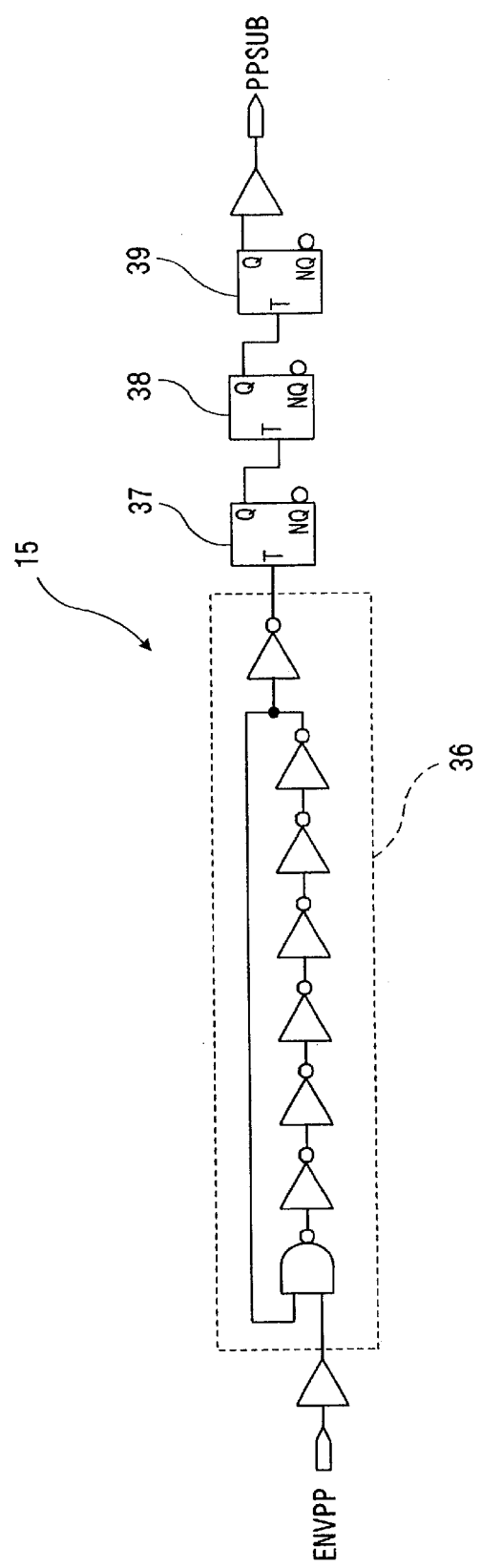
FIG. 6 is a structural diagram showing an oscillator for controlling an auxiliary boosted power source.

FIG. 6 shows an internal circuit of the oscillator 15 for determining the operation period of the auxiliary boosting circuit 13.

The oscillator 15 outputs a pulse as an actuating signal PPSUB of the auxiliary boosting circuit 13. The pulse is produced by a ring oscillator 36 and is demultiplied by T-type flip flops 37 to 39 connected in series.

In FIG. 6, in the case where the period of the ring oscillator 36 is set at 80 ns, since the T-type flip flops are arranged in three stages, the auxiliary boosting circuit 13 operates with a period of 640 ns.

The first boosting circuit 11 and the second boosting circuit 12 are equal to each other in boosting capability. The boosting capability of the auxiliary boosting circuit 13 is set lower than that of the first and second boosting circuits 11 and 12. The boosting capability is determined by the size of capacitor included in the charge pump circuit, and the capacitance of the capacitor included in the auxiliary boosting circuit 13 is set at about one tenth that of the first and second boosting circuits 11 and 12.

In a timing generating circuit (FIG. 7), output signals MG1, MG2, MG3, and MG4, which are respectively connected to the charge pump circuits, share a generated timing. Meanwhile, regarding the terminals MG1 and MG2 for transferring electric charge to the capacitors of the charge pump circuits, according to capacitances of capacitors of the boosting circuits 11 and 12 and the auxiliary boosting circuit 13, the MG1 and MG2 serving as signals connected to electric charge transfer capacitors are changed in capability of an output buffer.

Figure 7:
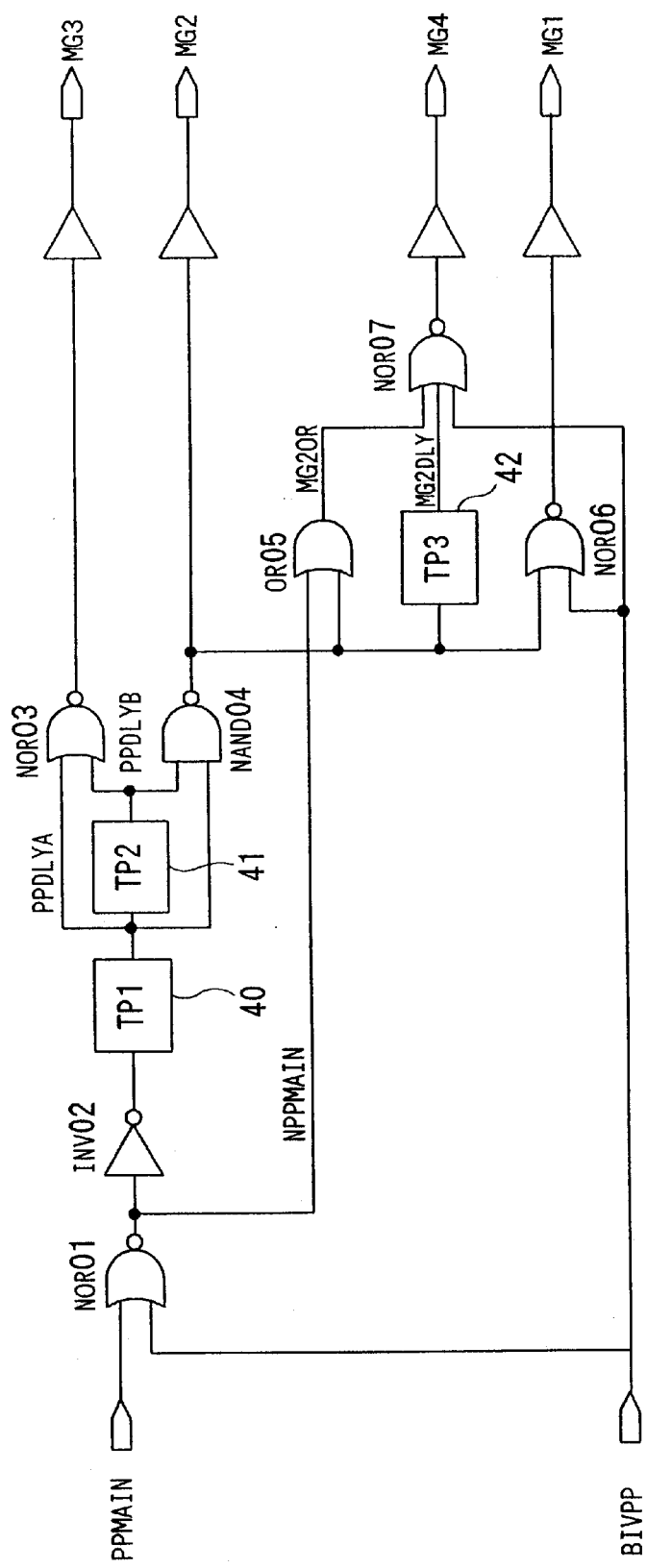
FIG. 7 is a structural diagram showing a timing generating circuit of the boosting circuit.
Figure 8:
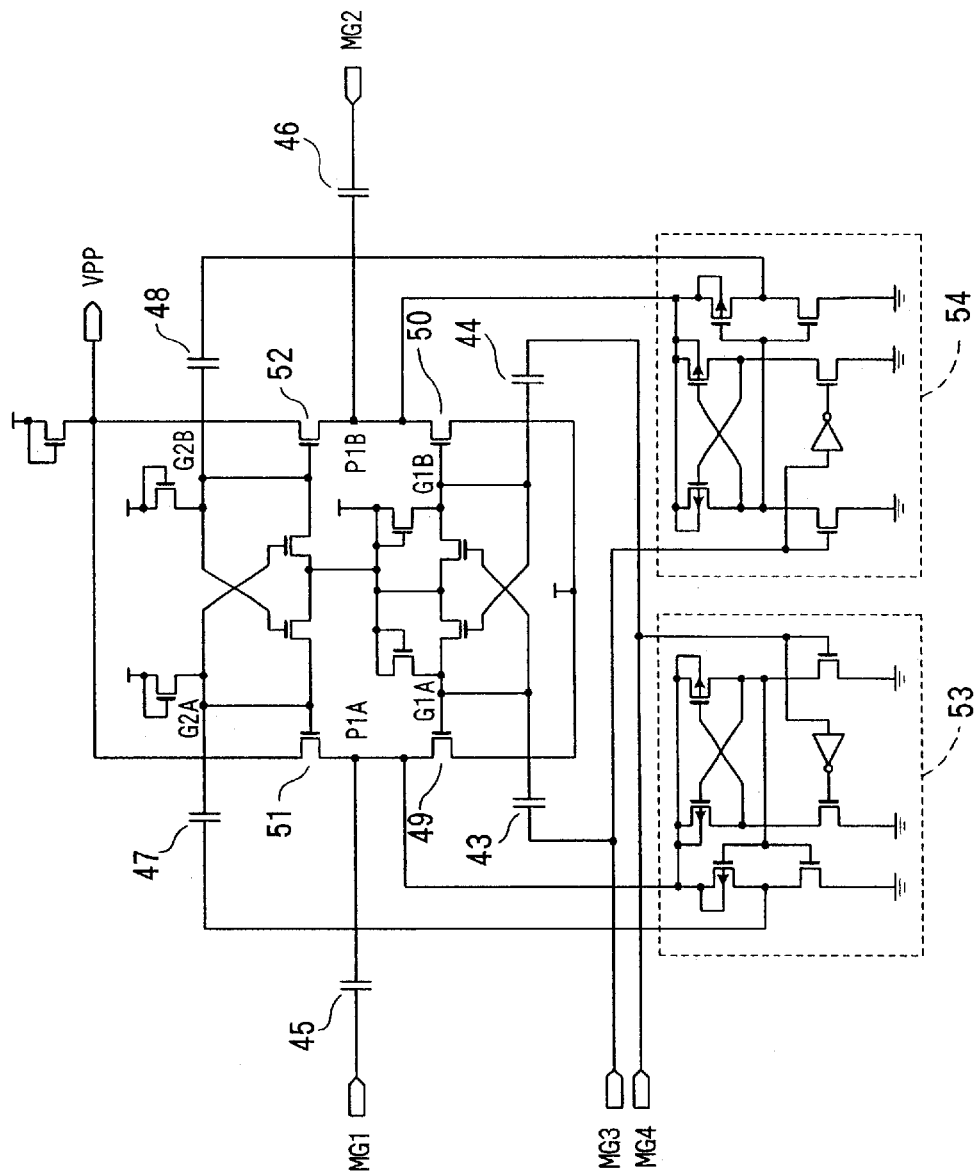
FIG. 8 is a structural diagram showing a charge pump circuit of the boosting circuit.
Figure 9:
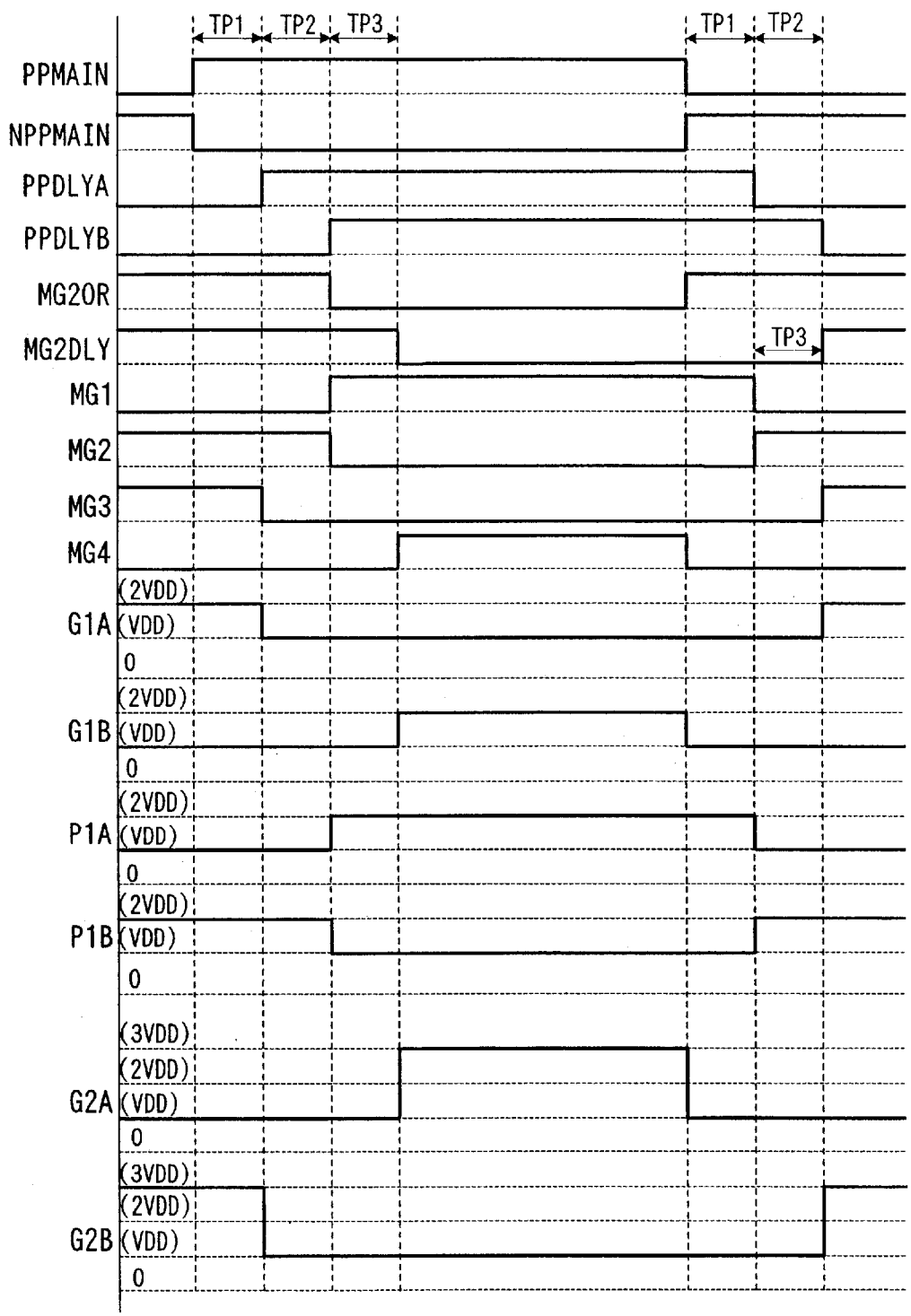
FIG. 9 is an operating timing chart of the boosting circuit.

FIG. 7 shows the timing generating circuit, FIG. 8 shows the charge pump circuit, and FIG. 9 shows an operating timing chart of the boosting circuit.

The following will discuss the operation of the timing generating circuit with reference to the timing chart. An input signal is denoted as PPMAIN and output signals are denoted as MG1 to MG4.

A signal is denoted as PPDLYA, which is delayed by a delay circuit 40 by time TP1 from a rising edge of the PPMAIN. A signal is denoted as PPDLYB, which is produced by delaying the PPDLYA by TP2 by a delay circuit 41.

When a signal outputted from the PPDLYA and PPDLYB via an inverted logical sum NOR03 is denoted as MG3 and a signal outputted via an inverted logical product NAND04 is denoted as MG2, the MG3 is a signal falling from H level to L level that is delayed by the time TP1 from the PPMAIN, and the MG2 is a falling signal delayed by time (TP1+TP2) from the PPMAIN. In a normal operation, the BIVPP is at L level and an inverted logical sum NOR06 acts as a negation. Thus, MG1 is an inverted signal of MG2, i.e., a rising signal delayed by time (TP1+TP2) from the PPMAIN. Since the BIVPP is also at L level, the MG4 is a signal produced by outputting three signal inputs of a signal MG2OR, a signal MG2DLY, and a fixed signal BIVPP at L level, via an inverted logical sum NOR07. The signal MG2OR is produced by passing the MG2 and an inverted signal NPPMAIN of the PPMAIN through a logical sum OR05, and the signal MG2DLY is produced by delaying the MG2 by time TP3 by the delay circuit 42. At this moment, the MG4 is a rising signal delayed by (TP1+TP2+TP3) from the PPMAIN.

In the same manner, regarding signals produced at a falling edge of the PPMAIN by the timing generating circuit, the MG4 is a falling signal in synchronization with the falling of the PPMAIN, the MG1 is a falling signal delayed by the time TP1, MG2 is a rising signal delayed by the time TP1, and the MG3 is a rising signal delayed by the time (TP1+TP2)

In the case where the DRAM circuit needs to operate in a test mode, in which the VPP is not produced by the boosting power circuit but is inputted from outside, for example, in an accelerated test such as a burn-in test, in response to the case where a mode is set for inputting the VPP from the outside to enhance acceleration, the timing generating circuit is provided with a VPP external input mode terminal BIVPP.

In the case where the BIVPP is at H level, outputs of the inverted NOR01, NOR06, and NOR07 of OR are fixed at L level, so that all the outputs of MG1 to MG4 do not vary their edges. The inverted NOR01, NOR06, and NOR07 include the BIVPP as one of the inputs. Therefore, electric charge is not transferred, so that a boosting operation is not performed in this state.

When the boosting circuit operates at a rising edge of the PPMAIN, as shown in FIG. 9, potentials of the internal nodes of the charge pump circuit shown in FIG. 8 are as follows: when a source voltage is set at VDD, the G1A is set at 2VDD, the G1B is set at VDD, the P1A is set at VDD, the P1B is set at 2VDD, the G2A is set at VDD, and the G2B is set at 3VDD. Further, transistors 50 and 51 are turned off at this moment. The transistors 50 and 51 each have a gate potential and a source potential equal to each other at VDD.

As earlier mentioned, the MG3 varies from H level to L level after being delayed by the time TP1 from a rising edge of the PPMAIN. At this moment, electric charge of a capacitor 43 is transferred and a potential of the G1A decreases to VDD. Simultaneously, an output of a level shifter 54 is set at L level, so that a capacitor 48 also transfers electric charge and a potential of the G2B is also set at VDD. Consequently, a transistor 52 is turned off and a path between the P1B and VPP is disconnected.

Moreover, according to a reduction in potential of the G1A, a transistor 49 acting as an electric charge transfer gate is also turned off, the P1A maintains a potential VDD, and a current path is interrupted. Hence, an operation for boosting to 2VDD can be performed according to the MG1 varying to H level.

When the time TP2 elapses in this state, the MG1 varies from L level to H level and the MG2 varies from H level to L level. At this moment, the capacitors 45 and 46 acting as a first boosting means transfer electric charge so as to increase a potential of the P1A from VDD to 2VDD and reduce a potential of the P1B from 2VDD to VDD.

According to an increase in potential of the P1A, maximum amplitude of a level shifter 53 varies to 2VDD. At this moment, the MG4 remains at L level, so that a potential of the G2A is maintained at VDD at this moment. When the MG4 varies from L level to H level, capacitors 47 and 48 acting as a second boosting means transfer electric charge, so that a potential of the G1B varies to 2VDD and a potential of the G2A varies from VDD to 3VDD. At this moment, the transistor 51 is turned on, a potential of the P1A is supplied to the VPP, and a potential of the VPP is boosted to VDD, which is twice larger than that of VPP.

In the case where the boosting circuit operates in response to the falling of the PPMAIN, as shown in FIG. 9, in contrast to the rising of the PPMAIN, potentials of the internal nodes shown in FIG. 8 are as follows: the G1A is set at VDD, the G1B is set at 2VDD, the P1A is set at 2VDD, the P1B is set at VDD, the G2A is set at 3VDD, the G2B is set at VDD, and the transistors 49 and 52 are turned off.

In synchronization with a falling edge of the PPMAIN, the MG4 firstly falls. A potential of the G1B decreases to VDD accordingly. Simultaneously, the transistor 50 is turned off and a level of the P1B is ready to increase. And then, after the time TP1 elapses, the MG1 varies from H level to L level and the MG2 varies from L level to H level, so that the capacitors 45 and 46 acting as the first boosting means transfer electric charge, the P1A varies from 2VDD to VDD, and the P1B varies from VDD to 2VDD.

After the time TP2 further elapses, an output level of the level shifter 54 is set at 2VDD according to variation in potential of MG3 and P1B. Thus, the capacitors 47 and 48 acting as the second boosting means transfer electric charge, so that a potential of the G2B is 3VDD and the transistor 52 is turned on. Hence, a path is made from the P1B to the VPP so as to set a potential of the VPP at 2VDD. In the circuit configured as above, if the load is not considered, a maximum boosted potential of the VPP is theoretically set at 2VDD.

As described above, in the charge pump circuit used in the present invention, an input signal varies at both of a rising edge and a falling edge and a maximum boosted potential is 2VDD. Hence, a sufficient boosting margin is achieved in response to a lower source voltage VDD.

Figure 10:
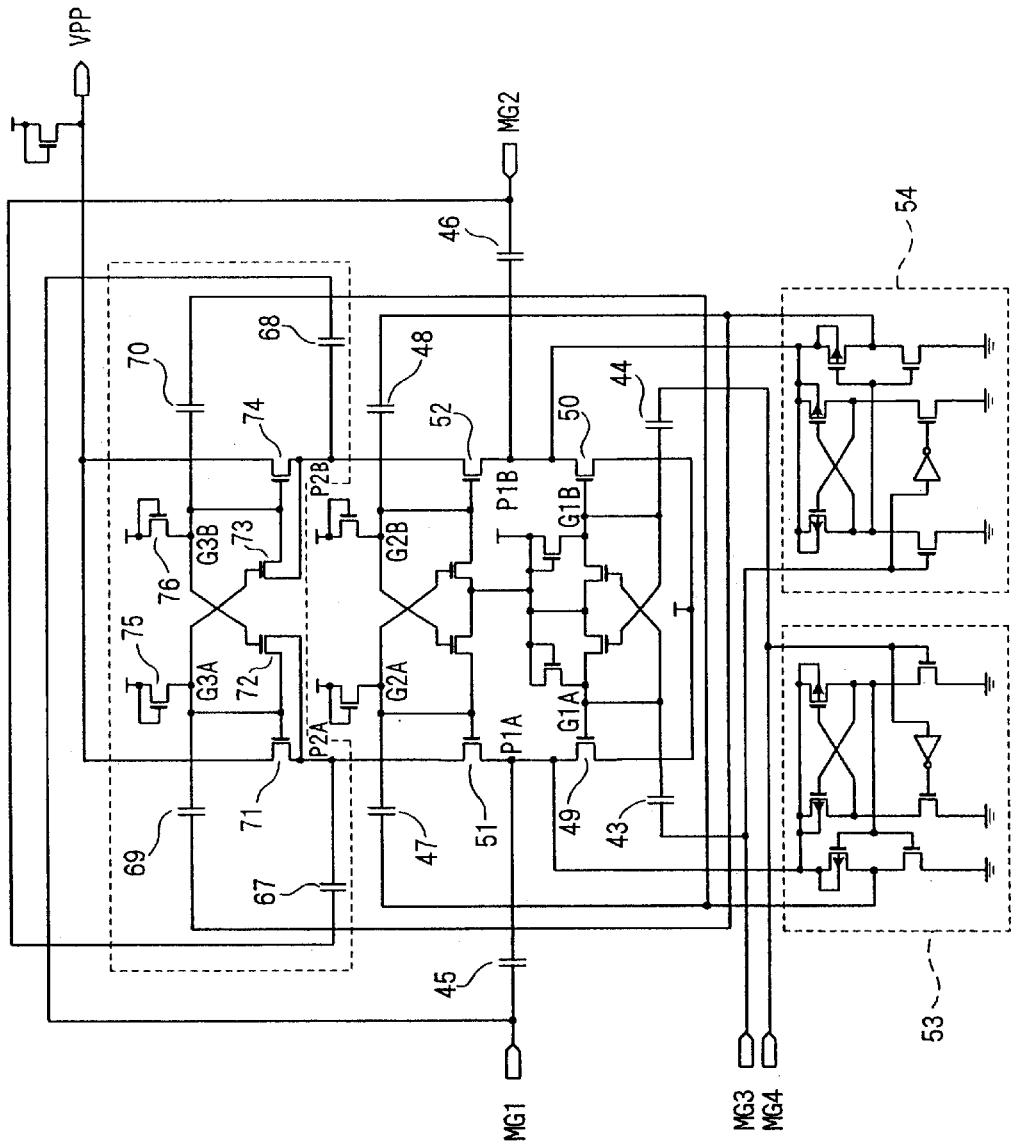
FIG. 10 is a structural diagram showing an example of an expanded charge pump circuit,it (output is triple source voltage)

Further, the configuration of the circuit is advantageous because it can be readily applied to a multi-stage boosting circuit. FIG. 10 shows an example of a charge pump circuit configured for a triple boosting of source voltage.

Capacitors 67 to 70 and transistors 71 to 76 are additional circuits achieving triple boosting. The circuits enclosed by wiggly lines are additional circuit units for n-time boosting. A $n_{th}$ boosting means is configured by the capacitors 69 and 70.

A node having the same node name as a double boosting circuit is equal to the double boosting circuit in potential value at the same timing. Hence, the following will discuss variation in potential of additional nodes.

In a boosting operation having a rising edge of the PPMAIN as a starting point, the G3A is reduced from 4VDD to 2VDD in response to the NG3 falling from H level to L level. Accordingly, the transistor 71 is turned off and a path between the P2A and VPP is interrupted. The P2A varies from 3VDD to 2VDD and the P2B varies from 2VDD to 3VDD according to variation of the MG1 and MG2. When the MG4 varies from L level to H level, the G3B varies from 2VDD to 4VDD so as to turn on the transistor 74 and transfer potential 3VDD of the P2B to VPP.

Also when the PPMAIN falls, operations in the circuit are symmetric, and potential 3VDD of the P2A is transferred to the VPP according to the G3A which varies to 4VDD when the MG3 varies from L level to H level.

If the above application comes into general use, such circuits are stacked on a point where the transistor has a maximum source potential of nVDD and a minimum source potential of (n−1)VDD, so that a maximum potential of nVDD is transferred to the output terminal VPP due to a function of the circuit configuration for boosting a voltage applied to the transistor gate to a maximum of (n+1)VDD.

Additionally, only a single timing is necessary for voltage applied to input control signals of the MG1 to MG4, regardless of the number of boosting stages.

Figure 11:
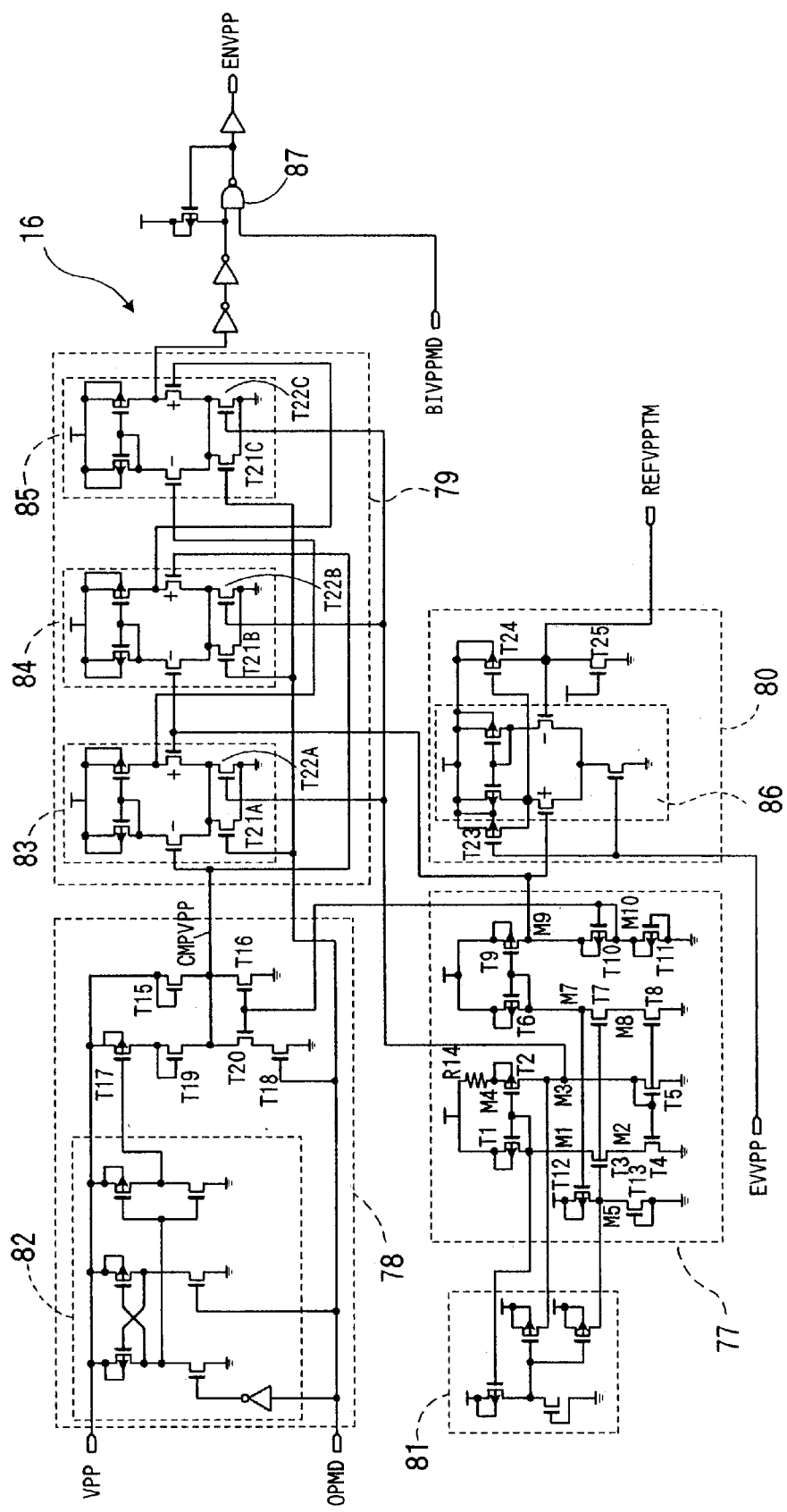
FIG. 11 is a structural diagram showing a detection circuit.

Referring to FIG. 11, the following will discuss the detection circuit 16 for detecting a boosted voltage to control the operation of the boosting circuit.

When the detection circuit 16 is divided based on functions, the configuration includes a constant voltage generating circuit 77 for generating constant voltage by a constant-current source circuit, a voltage drop circuit 78 for reducing the VPP, a differential amplifier circuit 79 acting as a first comparing means for comparing a reference voltage and a potential reduced from the VPP, a reference voltage measuring circuit 80 provided for measuring a reference voltage from the outside, and a start-up circuit 81 provided for setting the circuit at a stable point when turning on the power.

Inputs of the detection circuit 16 are a boosted potential VPP, a control signal OPMD set at H level while a memory activation signal rises and the memory is in an activated status, a control signal BIVPPMD for a test mode in which the ENVPP is always set at H level regardless of a potential of VPP and the boosting circuit is always operated, and a control signal EVVPP for operating the reference voltage measuring circuit 80 to measure a reference voltage generated by the constant voltage generating circuit 77.

Outputs of the detection circuit 16 are a control signal ENVPP for outputting, a comparison result between a reference voltage and a potential of the VPP to determine the operation of the boosting circuit, and the REFVPPTM for outputting a reference potential as an output of the reference voltage measuring circuit 80.

The constant voltage generating circuit 77 applies a current mirror circuit to realize its function. Current passing through a resistance R14 is dependent on source voltage.

The current is applied to M3, M1, and M7 according to each transistor size. Consequently, the M7 varies in potential, so that current applied to a transistor T12 so as to change a potential of M5. Thus, current applied to the transistors T3 and T7 is changed and stabilized at a balanced current value. For this reason, current generated by the circuit is constant regardless of source voltage.

Current passing through M9 is increased from current applied to the M7 with the size of transistors T6 and T9, and ON-state resistance of the transistors T10 and T11 allows a constant voltage to be generated in nodes M9 and M10.

In the voltage drop circuit 78, when a memory element is in a standby mode, namely, a control signal OPMD is at L level, a constant voltage M10, which is inputted to the gate terminal of a transistor T16, determines current applied to a current path of the transistor T15, T16 and a transistor T16. At this moment, based on the relationship between ON-state resistance of the transistor T16 and constant current generated by the transistor T15, a voltage drop potential CMPVPP produced from VPP is determined. When the memory element is in an activated status and OPMD is at H level, the N-channel transistor T18 and P-channel transistor T17 are respectively turned on, wherein the P-channel transistor T17 is turned by the OPMDVPP of which voltage is boosted by the voltage conversion circuit 82 to a potential equal to the VPP the OPMDVPP. In addition to a current bus of the transistors T15 and T16, a current bus of the transistors T19 and T20 is opened, so that response delay is prevented. Here, the transistors T17 and T18 form a switch, and the transistors T19 and T20 form a second voltage drop circuit.

The differential amplifier circuit 79 compares magnitudes of two potentials of the output M9 of the constant voltage generating circuit 77 and an output CMPVPP of the voltage drop circuit 78. To respond to small variation of the VPP and a small difference in potential between the M9 and CMPVPP, the M9 and CMPVPP are inputted to differential amplifiers 83 and 84 so as to be opposite in phases, and an obtained determination result on a potential difference is inputted to a differential amplifier 85, so that a final comparison result ENVPP is obtained.

To the differential amplifiers 83, 84, and 85, potential M10 generated in the constant voltage generating circuit 77 is inputted as current source from transistors T22A, T22B, and T22C. When the OPMD is at H level, an H-level signal OPMD is directly applied as current source from T21A, T21B, and T21C, and current applied to the differential amplifiers is increased, resulting in faster response speed.

Next, the following will discuss a test mode controlled by the detection circuit 16.

In a normal operation of a memory element, a boosted source potential is set at a minimum boosted potential to prevent damage on a memory cell. In an accelerated test, which is a quality test applying heavy burden to a circuit element and removing defective devices, the test is conducted while source voltage is raised. At this moment, as compared with a normal operating state, it is necessary to apply a high voltage to a node which requires boosted power source such as word driver driving voltage to enhance acceleration.

The detection circuit 16 adopted for the present invention is characterized by the absence of dependency on source voltage. Hence, in order to respond to an accelerated test, operation modes corresponding to the following are prepared.

(1) A mode for suspending the operation of the boosting power circuit and driving a word driver by input from an external power source.

(2) A mode for changing an operating voltage of the boosting power circuit based on a setting of a test mode. As mentioned in the description on the boosting circuit, (1) is realized by suspending a boosting operation by interrupting a control signal of the charge pump circuit.

Regarding the latter mode, i.e., a test mode which corresponds to (2) for changing an operating voltage of the boosted power source, an output of the differential amplifier circuit 79 and a control terminal BIVPPMD for setting a test mode are outputted through a negation 87 of a logical product.

When the BIVPPMD is at L level, the ENVPP is changed by an output of the differential amplifier circuit 79. When the BIVPPMD is at H level, an output of the negation 87 of a logical product is always set at H level, so that output ENVPP of the detection circuit is always set at H level. Consequently, the charge pump circuit is operated all the time. As mentioned in the description on the boosting circuit, the charge pump circuit adopted in the present invention is about twice larger than source voltage in boosting capability. Thus, with a mode setting for full-time operation, it is possible to change a boosted voltage.

In a test mode where a control signal EVVPP is set at H level, T23 is inactivated, T24 is activated, and the differential amplifier 86 acting as a second comparing means is activated so as to operate the reference voltage measuring circuit 80 and copy a potential of the M9 to an output REFVPPTM. The reference voltage measuring circuit 80 is configured such that a potential of the M9 is connected to one of the inputs of the differential amplifier 86, the output REFVPPTM is connected to the other input, an N-channel transistor T25 is controlled based on its comparison result, and an output voltage is varied so as to feed back the voltage. Balance is kept such that an input potential and an output potential are equal to each other. With this configuration, a potential equal to the reference potential M9 is outputted to the REFVPPTM.

Additionally, the present specification described an example in which two charge pump circuits are used for rising and falling edges on a period of a memory activation signal so as to adjust a boosting timing. Theoretically, assuming that cycle time of the memory is further shortened, it may be more desirable to produce a control signal having rising and falling edges in a period twice a reading and writing cycle, in view of a boosting capacity and an operating speed margin. At this moment, in order to adjust a boosting timing as the foregoing Embodiment, it is necessary to provide four charge pump circuits. Therefore, the scope of the present invention do not impose any limitations on the number of main charge pump circuits provided in the boosting power circuit and a period of a control signal produced with an internal memory activation signal serving as a seed signal.

What is claim is:

1. A detection circuit for detecting a voltage level of a boosted power supply for controlling an operation of a boosting circuit supplying power to a functional block in a semiconductor integrated circuit, said detection circuit comprising:

a constant voltage generating circuit for generating a reference voltage that is constant regardless of a source voltage;

a voltage drop circuit for generating a reduced voltage from a boosted power supply voltage; and a differential amplifier circuit for comparing said reduced voltage to said reference voltage and generating an output signal indicative of a comparison result of said boosted power supply voltage, said differential amplifier circuit including means for changing a response speed in response to a control signal indicative of an operation mode such that said differential amplifier circuit responds faster when a functional block in a semiconductor integrated circuit is activated than when the block is in a non-activated state.

2. The detection circuit as set forth in claim 1, wherein said constant voltage generating circuit is for generating a constant voltage for controlling a current source transistor, and said changing means comprises first and second driving transistors as current sources for a differential amplifier, said first and second transistors receiving said constant voltage and said control signal respectively.

3. The detection circuit as set forth in claim 1, wherein said voltage drop circuit includes first and second current paths located in parallel between a first power supply line for applying said boosted power supply voltage thereto and an output node for outputting said reduced voltage therefrom, and third and fourth current paths located in parallel between said output node and a ground terminal, said second and fourth current paths being enabled by said control signals.

4. The detection circuit as set forth in claim 3, wherein said constant voltage generating circuit is for generating a constant voltage for use in said voltage drop circuit, each of said first and second current paths comprises a transistor, each of said third and fourth current paths comprises a transistor receiving said constant voltage, and each of said second and fourth current paths further comprises a switch transistor controlled by said control signal.

5. The detection circuit as set forth in claim 1, wherein said differential amplifier circuit comprises:

a first differential amplifier for receiving said first constant voltage and said reduced voltage;

a second differential amplifier for receiving said first constant voltage and said reduced voltage opposite in phase with respect to said first differential amplifier; and a third differential amplifier for receiving respective outputs of said first and second differential amplifiers to obtain a final comparison result.

6. The detection circuit as set forth in claim 5, wherein said constant voltage generating circuit is for generating a constant voltage for controlling current source transistors and each said differential amplifier comprises first and second driving transistors as current sources for each said differential amplifier, said first and second driving transistors for receiving said constant voltage and said control signal respectively, thereby changing a response speed of said differential amplifier circuit in response to said control signal.

* * * * *